United States Patent
Deppe et al.

(10) Patent No.: US 7,274,069 B2
(45) Date of Patent: Sep. 25, 2007

(54) MEMORY CELL

(75) Inventors: Joachim Deppe, Dresden (DE); Christoph Kleint, Dresden (DE); Christoph Ludwig, Langebruck (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 10/913,707

(22) Filed: Aug. 5, 2004

(65) Prior Publication Data

US 2005/0030780 A1  Feb. 10, 2005

Related U.S. Application Data

(63) Continuation of application No. PCT/DE03/00135, filed on Jan. 17, 2003.

(30) Foreign Application Priority Data

Feb. 6, 2002  (DE) .................. 102 04 868

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/330; 257/302; 257/315; 257/330; 438/270

(58) Field of Classification Search ............. 257/330, 257/333, 441, 302, 304, 400, 315, 317, 321; 437/40; 438/40
See application file for complete search history.

(56) References Cited

U.S. PATENT DOCUMENTS

| 4,830,975 A | 5/1989 | Bovaird et al. |
| 5,252,845 A * | 10/1993 | Kim et al. ............... 257/302 |
| 5,424,231 A * | 6/1995 | Yang ........................ 438/270 |
| 6,191,459 B1 | 2/2001 | Hofmann et al. |
| 6,309,924 B1 | 10/2001 | Divakaruni et al. |
| 6,469,345 B2 * | 10/2002 | Aoki et al. .............. 257/330 |
| 2001/0008291 A1 * | 7/2001 | Aoki et al. .............. 257/330 |
| 2002/0024092 A1 | 2/2002 | Palm et al. |
| 2003/0015752 A1 * | 1/2003 | Palm et al. .............. 257/315 |

FOREIGN PATENT DOCUMENTS

| DE | 100 39 441 A1 | 2/2002 |
| DE | 100 41 749 A1 | 3/2002 |
| JP | 4-12573 A1 | 1/1992 |

* cited by examiner

*Primary Examiner*—Andy Huynh
*Assistant Examiner*—Tram H Nguyen
(74) *Attorney, Agent, or Firm*—Dickstein, Shapiro, LLP.

(57) ABSTRACT

In a memory cell, in a trench, a layer sequence comprising a first oxide layer, a nitride layer provided on the first oxide layer, and a second oxide layer, facing the gate electrode, and provided at the lateral trench walls, while the nitride layer is absent in a curved region of the trench bottom. In an alternative configuration, in each case at least one step is formed at the lateral walls of the trench, preferably below the source region or the drain region, respectively.

5 Claims, 5 Drawing Sheets

MEMORY CELL

CROSS-REFERENCE TO RELATED APPLICATION

This application is a continuation of International Patent Application Ser. No. PCT/DE03/00135, filed Jan. 17, 2003, which published in German as WO 03/067668 on Aug. 14, 2003, and is incorporated herein by reference in its entirety.

FIELD OF THE INVENTION

The present invention relates to a memory cell having a memory transistor formed as a trench transistor.

BACKGROUND OF THE INVENTION

As a result of the increasing miniaturization of electronic components generally and memory products in particular, it is becoming more and more important to complete the transition from planar to vertical structures in order to achieve larger packing densities in conjunction with geometries that are still manageable in terms of fabrication technology. In the case of NROM memories, it is conceivable to embody the oxide-nitride-oxide layer (ONO) with a U-shaped cross section (UMEM component), so that a larger channel length does not necessarily take up a larger chip area. In this case, the individual memory cells are formed as transistor structures in a trench in the semiconductor material. In the case of the transistor structures, an oxide-nitride-oxide layer sequence is present as storage medium in each case between a source region and the gate electrode and between a drain region and the gate electrode. Such a configuration of the memory cells is described in DE 100 39 441 A1.

SUMMARY OF THE INVENTION

It is an object of the present invention to specify a memory cell having a trench transistor of the type described in the introduction whose functionality is improved.

In the case of the memory cell, in the trench, a layer sequence comprising a first oxide layer, facing the semiconductor material, a nitride layer and a second oxide layer, facing the gate electrode, is present at the lateral walls of the trench, while the nitride layer is absent in a curved region of the trench bottom. In an alternative configuration, in each case at least one step is formed at the lateral walls of the trench. Said step is preferably situated below the source region or the drain region, respectively.

BRIEF DESCRIPTION OF THE DRAWINGS

Examples of the memory cell are described in more detail below with reference to FIGS. 1 to 5.

DETAILED DESCRIPTION OF THE PREFERRED MODE OF THE INVENTION

In each of the figures, the first oxide layer facing the semiconductor material is designated by the reference symbol 1, the nitride layer is designated by the reference symbol 2, and the second oxide layer facing the gate electrode in the trench is designated by the reference symbol 3.

Figure 1A:
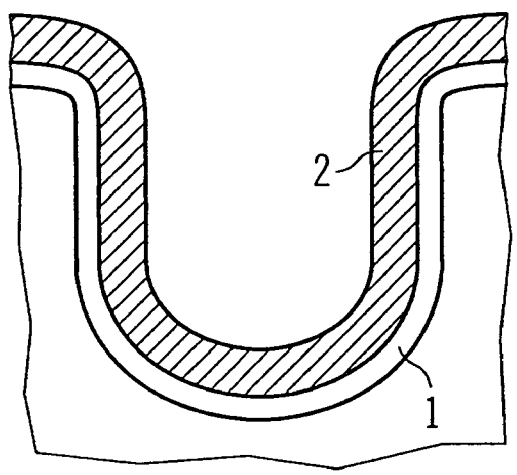
FIGS. 1A-1C, 2A-2D, 3A-3D, and 4A-4G show diagrammatic cross sections of intermediate products after different method steps of four different production methods for the memory cell of the first alternative.
Figure 1B:
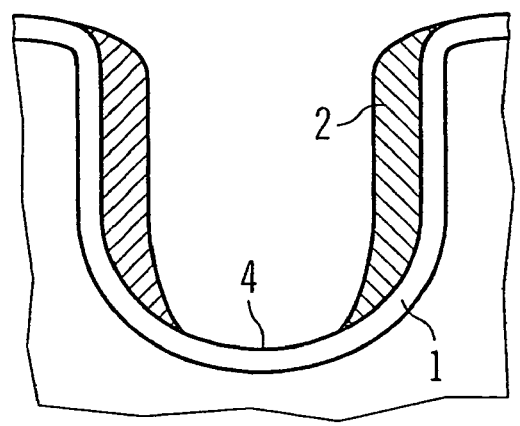
Figure 1C:
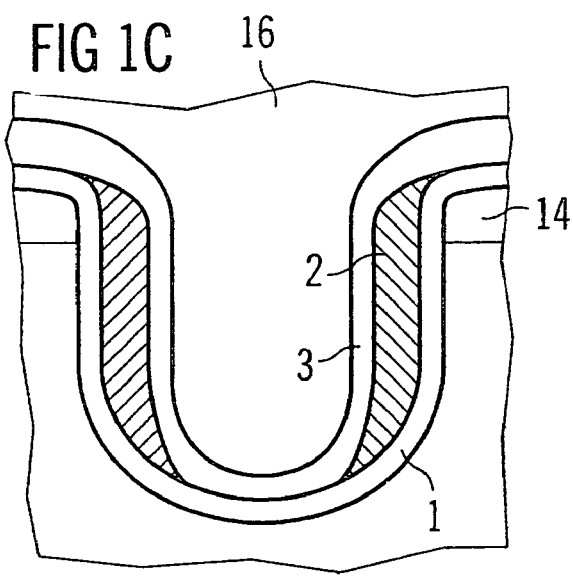

FIG. 1A shows a cross section through the trench in the semiconductor material after the application of the first oxide layer 1 and the nitride layer 2. The nitride is then etched anisotropically, so that the first oxide layer 1 is uncovered at the trench bottom in a curved region 4 (FIG. 1B). The second oxide layer 3 is then applied over the whole area in accordance with FIG. 1C. In the curved region 4 of the trench bottom in which the nitride layer 2 is absent, the oxide is then present in a layer which is thicker than the first oxide layer 1. The ONO layer sequence, in which the nitride layer 2 is present only at the perpendicular trench walls, i.e. between the source region and the gate electrode and between the gate electrode and the drain region, is obtained in this way. The material for the gate electrode is then deposited into the opening of the trench onto the ONO layer sequence, which is known per se and need not be explained here.

Figure 2A:
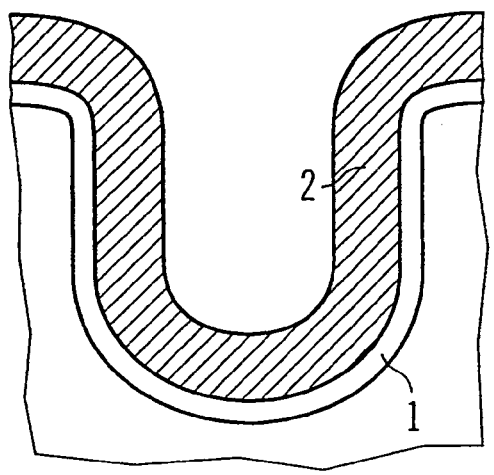
Figure 2B:
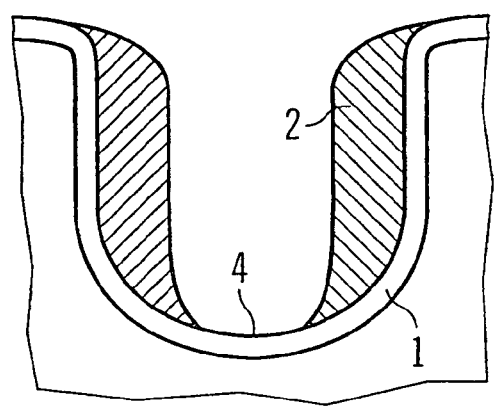
Figure 2C:
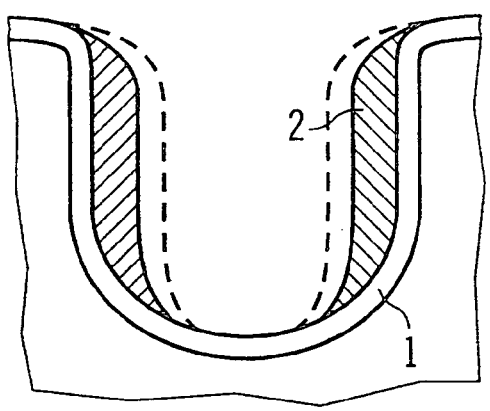
Figure 2D:
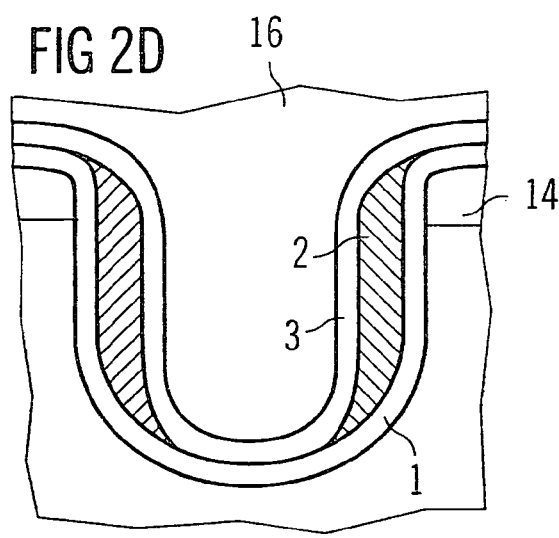
Figure 3A:
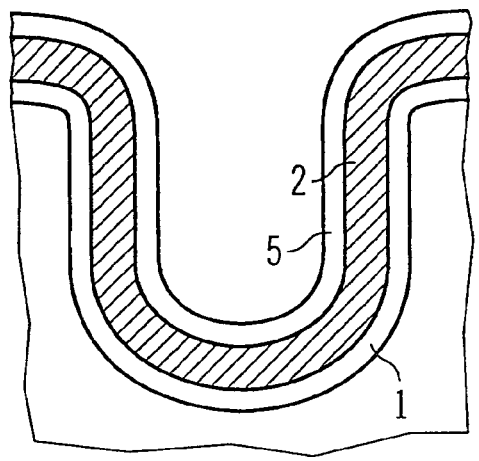
Figure 3B:
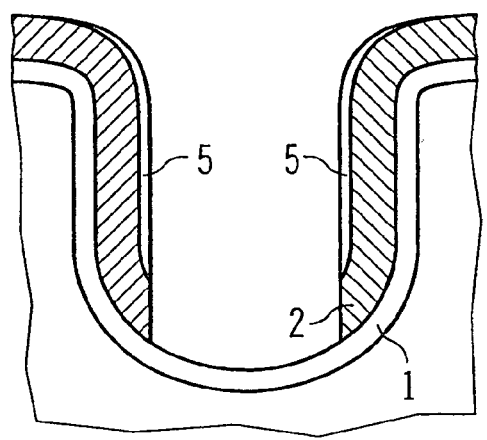
Figure 3C:
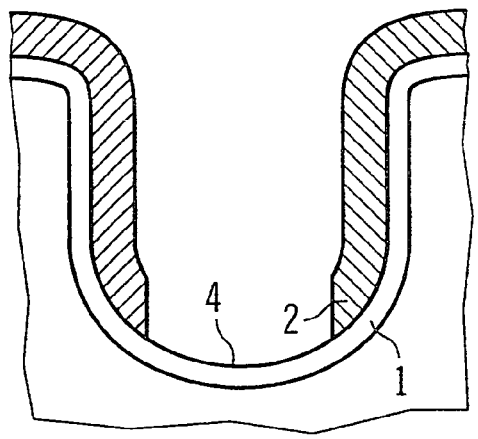
Figure 3D:
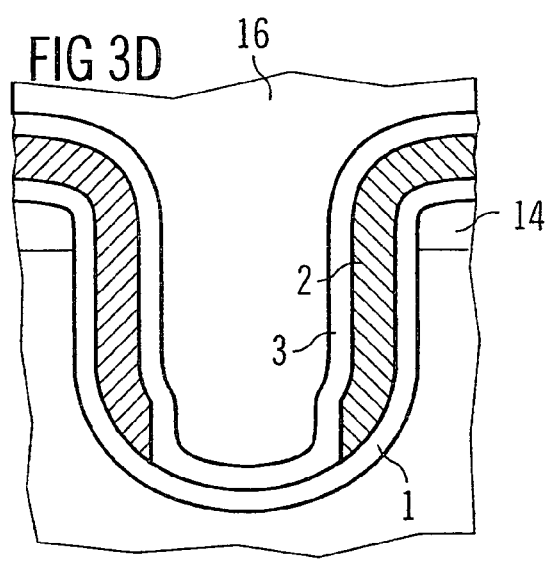
Figure 4A:
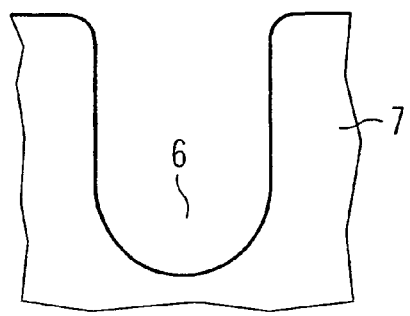
Figure 4B:
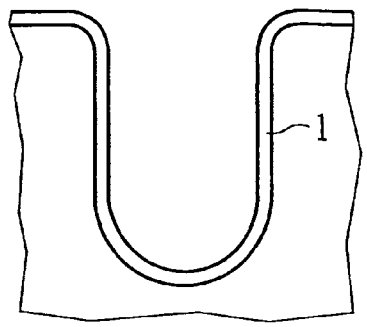
Figure 4C:
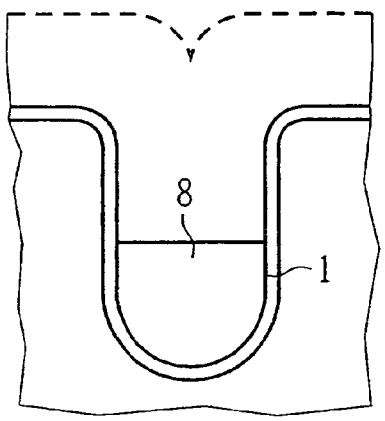
Figure 4D:
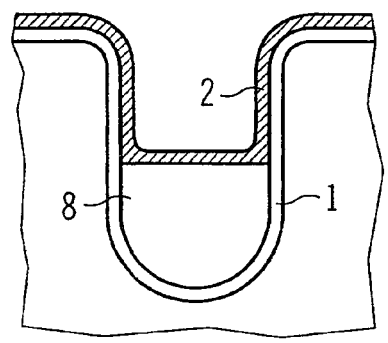
Figure 4E:
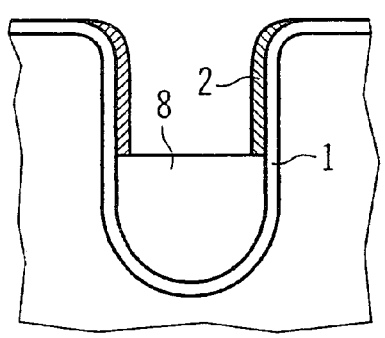
Figure 4F:
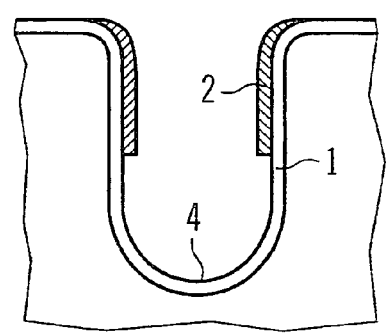
Figure 4G:
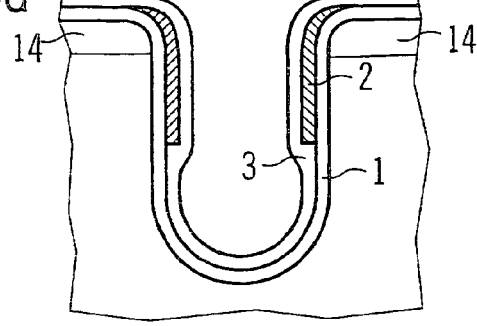

In an alternative configuration of the method in accordance with FIG. 2, the nitride layer 2, in accordance with FIG. 2A, is deposited with a greater thickness than in the first example. The nitride layer 2 is then etched anisotropically in order to uncover the curved region 4 of the trench bottom (FIG. 2B). Afterward, the nitride is etched isotropically in order to remove a surface of the nitride layer 2 that has been attacked or damaged in the first etching step, which is indicated in FIG. 2C, in which the broken line represents the original thickness of the nitride layer 2. The second oxide layer 3 is then applied over the whole area in accordance with FIG. 2D. In principle, this yields the same structure as in the example which was described with reference to FIG. 1; however, the nitride layer 2 is formed with a better interface toward the second oxide layer 3.

A further possibility is illustrated in FIG. 3. Here, after the application of the first oxide layer 1 and the nitride layer 2, firstly an auxiliary layer 5 is applied as sacrificial layer (FIG. 3A). The auxiliary layer 5 is e.g. oxide or polysilicon. In a subsequent anisotropic etching step, the auxiliary layer 5 and the nitride layer 2 are removed at the bottom of the trench, so that the structure in accordance with FIG. 3B remains. Residues of the auxiliary layer 5 are still present here at the lateral trench walls. Said residues of the auxiliary layer 5 protect the nitride layer 2 at the lateral trench walls, while the nitride layer 2 is removed in the curved region 4 of the trench bottom. The residues of the auxiliary layer 5 are removed in a subsequent isotropic etching step, thereby producing the structure illustrated in FIG. 3C. The second oxide layer 3 is then applied over the whole area, thereby producing the structure illustrated in FIG. 3D. The use of polysilicon as an auxiliary layer 5 has the advantage that the residues of the auxiliary layer 5 can be removed, in accordance with FIG. 3B, without the first oxide layer 1 which is uncovered at the trench bottom being concomitantly removed to the same extent.

FIG. 4 illustrates a further possibility of production, in which the entire curved region of the trench bottom is freed of the nitride. Proceeding from a trench 6 produced in the semiconductor material 7 (FIG. 4A), firstly the first oxide layer 1 (FIG. 4B) is deposited over the whole area. The trench is then filled with polysilicon, which is indicated by the boundary depicted by a broken line in FIG. 4C. The polysilicon is etched back right into the trench, so that only the lower portion 8 of the polysilicon remains in the trench. The nitride layer 2 is then deposited over the whole area in accordance with FIG. 4D. An anisotropic etching step eliminates the nitride layer 2 on the lower portion 8 of the polysilicon (FIG. 4E). The polysilicon is removed from the trench, which can be done, e.g. by means of wet-chemical etching. The entire curved region 4 of the trench bottom is then freed of the nitride layer 2 in accordance with FIG. 4F. The second oxide layer 3 is then applied over the whole area in accordance with FIG. 4G. In the curved region of the trench bottom in which the nitride layer 2 is absent, the oxide is present, in this exemplary embodiment, too, in a layer which is thickener than the first oxide layer 1. Consequently, this variant of the production method yields a structure of the ONO layer sequence in which the nitride layer 2 already stops relatively far up, so that the entire curved bottom region of the trench is free of the nitride. A charge carrier injection into the nitride layer during the programming of the cell is therefore shifted relatively far upward in this embodiment.

In this first alternative of the memory cell, the nitride is not present in the curved lower part of the oxide layers, but rather only in the upper part of the ONO layer. The injection or storage of charges at the locations of relatively great curvature of the trench bottom is thus prevented since oxide has a lower trapping probability for electrons than nitride. As a result, the programming of the cell at undesirable locations is prevented and the functionality of the component is improved.

The second alternative of the memory cell provides for the configuration of a step in the upper region of the trench walls. An example of this embodiment and of an associated production method is described with reference to FIG. 5. A pad oxide layer 9 is applied to the top side of the semiconductor material 7 of a semiconductor body or a semiconductor layer and a pad nitride layer 10 is applied to said pad oxide layer, which layers can be produced in a manner known per se by means of LPCVD (low pressure chemical vapor deposition). A suitable photomask technique is used to produce a respective opening into this layer sequence in a manner known per se in the region of the trenches 6 to be produced, the semiconductor material 7 being etched out through said opening. The trenches can be etched e.g. by means of a plasma etching method.

Figure 5A:
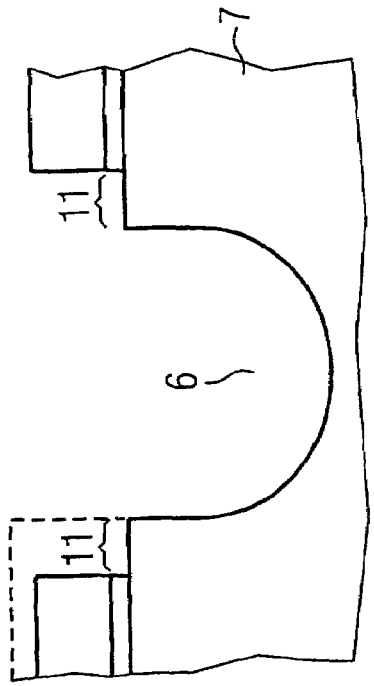
FIGS. 5A-5D show the intermediate products after different method steps of a production method for the memory cell of the second alternative.
Figure 5C:
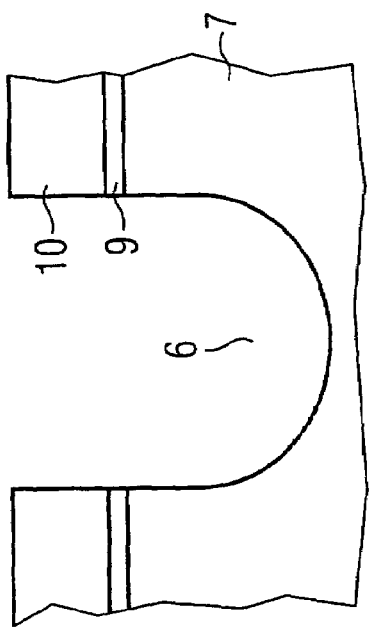
Figure 5B:
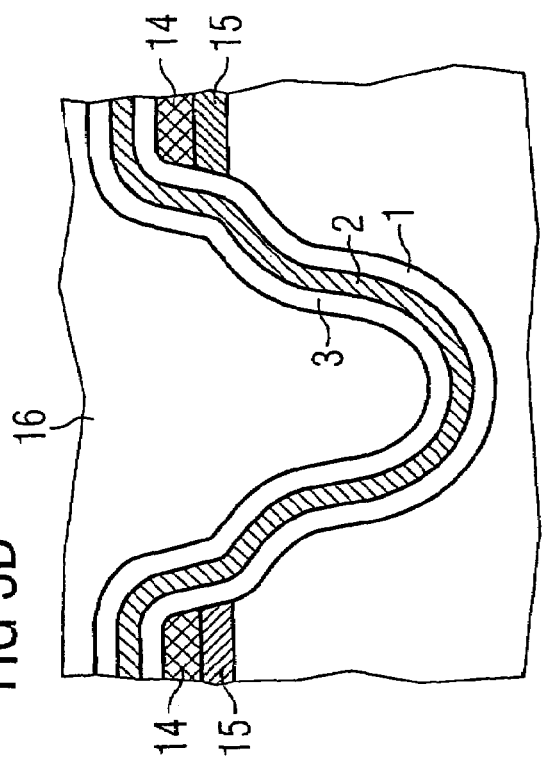

After the removal of the photomask and a cleaning step, a so-called pullback of the pad oxide layer 9 and the pad nitride layer 10 is effected, as a result of which, in accordance with FIG. 5B, the edge of said layers is set back somewhat from the trench 6 with respect to the original dimensions represented by the dashed contour in FIG. 5B. The narrow regions 11, in which the semiconductor material 7 is uncovered, thus remain between the trench and said layers.

There then follows an anisotropic etching step, preferably a plasma etching, by means of which the structure present in FIG. 5B is sunk further into the semiconductor body. The direction of the anisotropic etching is depicted by the arrows 12 in FIG. 5C. Trenches etched out more deeply with the steps 13 on both sides are produced in this way. This form of the trench produces a relatively great curvature of the trench walls at the steps 13, so that the region of maximum field strength in the channel of the transistor structure is shifted into the region of said steps. Therefore, during the programming of the cell, the charge carrier injection into the storage layer takes place at the positions of said steps 13.

Figure 5D:
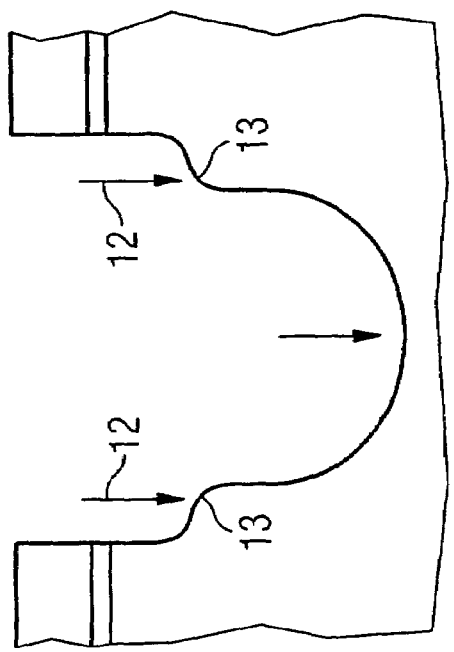

FIG. 5D illustrates the cross section of the completed memory cell with the ONO layer sequence as storage layer. There are applied over the whole area at the trench walls firstly a first oxide layer 1, the nitride layer 2 thereon and a second oxide layer 3 thereon. The source and drain regions 14 are present on both sides of the trench, said regions being doped in n-conducting fashion in the example and being bounded by more lightly doped regions 15 after the outdiffusion of dopant. The trench is filled with the gate electrode 16, for which preferably polysilicon is deposited. The step 13 lies below the source and drain regions.

The invention claimed is:

1. A memory cell having a memory transistor comprising:
a gate electrode which is formed in a trench at a top side of a semiconductor body or a semiconductor layer and arranged between a source region and a drain region, which are located at the upper surface of the semiconductor material, and is isolated from the semiconductor material by dielectric material, wherein, between the source region and the gate electrode and between the drain region and the gate electrode, there is a layer sequence which comprises:
a first oxide layer facing the semiconductor material;
a nitride layer provided on the first oxide layer; and
a second oxide layer, facing the gate electrode, and provided at least at lateral walls of the trench,
wherein the nitride layer is absent in a curved region of the trench bottom, and
in the curved region of the trench bottom in which the nitride layer is absent, the second oxide layer is present, and the first oxide layer and the second oxide layer together are thicker than the first oxide layer.

2. A memory cell having a memory transistor comprising:
a gate electrode which is formed in a trench at a top side of a semiconductor body or a semiconductor layer and arranged between a source region and a drain region, which are located at the upper surface of the semiconductor material, and is isolated from the semiconductor material by dielectric material, wherein, between the source region and the gate electrode and between the drain region and the gate electrode, there is a layer sequence which comprises:
a first oxide layer facing the semiconductor material;
a nitride layer provided on the first oxide layer; and
a second oxide layer, facing the gate electrode, and provided at least at lateral walls of the trench,
wherein the nitride layer is absent in a curved region of the trench bottom, and wherein the nitride layer is present only at the walls of the trench above a curvature of the trench bottom, and the depth of the trench measured in a vertical direction from the upper surface of the semiconductor material to the trench bottom is at least double the depth of the nitride layer in this vertical direction.

3. A memory cell having a memory transistor comprising:
a gate electrode formed in a trench at a top side of a semiconductor body or a semiconductor layer and arranged between a source region and a drain region, which are formed in the semiconductor material at the upper edges of the trench, and is isolated from the semiconductor material by dielectric material, wherein, between the source region and the gate electrode and between the drain region and the gate electrode, there is a layer sequence comprising:
a first oxide layer, facing the semiconductor material;
a nitride layer provided on the first oxide layer; and a second oxide layer, facing the gate electrode, and provided at least at lateral walls of the trench, wherein at least one step is formed in each of the lateral walls of the trench which are the walls of the semiconductor body or the semiconductor layer, and wherein at least one corresponding step is formed in the nitride layer that continuously covers the at least one step formed within the semiconductor body or the semiconductor layer.

4. The memory cell as claimed in claim 3, wherein the at least one step is present above a curvature of the trench bottom.

5. The memory cell as claimed in claim 3, wherein the at least one step is arranged below the source region or the drain region, respectively.

* * * * *